United States Patent
Maenishi et al.

(10) Patent No.: US 9,781,837 B2
(45) Date of Patent: Oct. 3, 2017

(54) ELECTRONIC COMPONENT MOUNTING SYSTEM AND EQUIPMENT UNIT MANAGEMENT METHOD FOR ELECTRONIC COMPONENT MOUNTING SYSTEM

(71) Applicant: PANASONIC INTELLECTUAL PROPERTY MANAGEMENT CO., LTD., Osaka (JP)

(72) Inventors: Yasuhiro Maenishi, Yamanashi (JP); Norihisa Yamasaki, Yamanashi (JP); Yuji Nakamura, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 404 days.

(21) Appl. No.: 14/402,832

(22) PCT Filed: Feb. 21, 2013

(86) PCT No.: PCT/JP2013/000988
§ 371 (c)(1),
(2) Date: Nov. 21, 2014

(87) PCT Pub. No.: WO2013/175677
PCT Pub. Date: Nov. 28, 2013

(65) Prior Publication Data
US 2015/0173205 A1 Jun. 18, 2015

(30) Foreign Application Priority Data
May 21, 2012 (JP) ................ 2012-115305

(51) Int. Cl.
*H05K 3/30* (2006.01)
*G05B 19/418* (2006.01)
*H05K 13/08* (2006.01)

(52) U.S. Cl.
CPC ....... *H05K 3/301* (2013.01); *G05B 19/41865* (2013.01); *H05K 13/08* (2013.01);
(Continued)

(58) Field of Classification Search
CPC .. H05K 3/301; H05K 13/08; Y10T 29/53174; Y10T 29/4913
(Continued)

(56) References Cited

U.S. PATENT DOCUMENTS

2006/0085973 A1  4/2006  Kodama et al.
2010/0325860 A1  12/2010  Maenishi
(Continued)

FOREIGN PATENT DOCUMENTS

CN  101436065 A  5/2009
CN  101908166 A  12/2010
(Continued)

OTHER PUBLICATIONS

Chinese Office Action for Application No. 201380026682.7 dated Apr. 25, 2016.
(Continued)

*Primary Examiner* — Peter DungBa Vo
*Assistant Examiner* — Azm Parvez
(74) *Attorney, Agent, or Firm* — Pearne & Gordon LLP

(57) ABSTRACT

An electronic component mounting system stores: manufacturing plan data for each manufacturing lot; unit management data including use permission information indicating a use permission status of an equipment unit; and inventory data indicating a stock status of the equipment units. In a unit reservation processing, new allocation processing is performed for allocating an equipment unit necessary for manufacture of a new manufacturing lot to an equipment unit for a new manufacturing lot, and an allocation result is registered. The system determines whether an equipment unit of an allocation subject in the new allocation processing can be allocated to an equipment unit for the new manufacturing lot by referring to use permission information of the equipment unit, and if the equipment unit is determined as being usable, the unit reservation processing is performed.

8 Claims, 9 Drawing Sheets

(52) U.S. Cl.
CPC .............. *Y02P 90/04* (2015.11); *Y02P 90/20* (2015.11); *Y10T 29/4913* (2015.01); *Y10T 29/53174* (2015.01)

(58) Field of Classification Search
USPC ...... 29/832, 829, 825, 592.1, 739, 740, 729, 29/700
See application file for complete search history.

(56) References Cited

U.S. PATENT DOCUMENTS

| | | |
|---|---|---|
| 2011/0225811 A1 | 9/2011 | Kodama et al. |
| 2014/0026410 A1 | 1/2014 | Kodama et al. |

FOREIGN PATENT DOCUMENTS

| | | | |
|---|---|---|---|
| CN | 101953242 A | | 1/2011 |
| JP | 06-187354 A | | 7/1994 |
| JP | 10-229293 A | | 8/1998 |
| JP | 10229293 A | * | 8/1998 |
| JP | 2000-208987 A | | 7/2000 |
| JP | 2008-147313 A | | 6/2008 |
| JP | 2009-141335 A | | 6/2009 |
| JP | 2011-258984 A | | 12/2011 |

OTHER PUBLICATIONS

Chinese Search Report for Application No. 201380026682.7 for Office Action dated Apr. 25, 2016.
International Search Report for Application No. PCT/JP2013/000988 dated May 28, 2013.

* cited by examiner

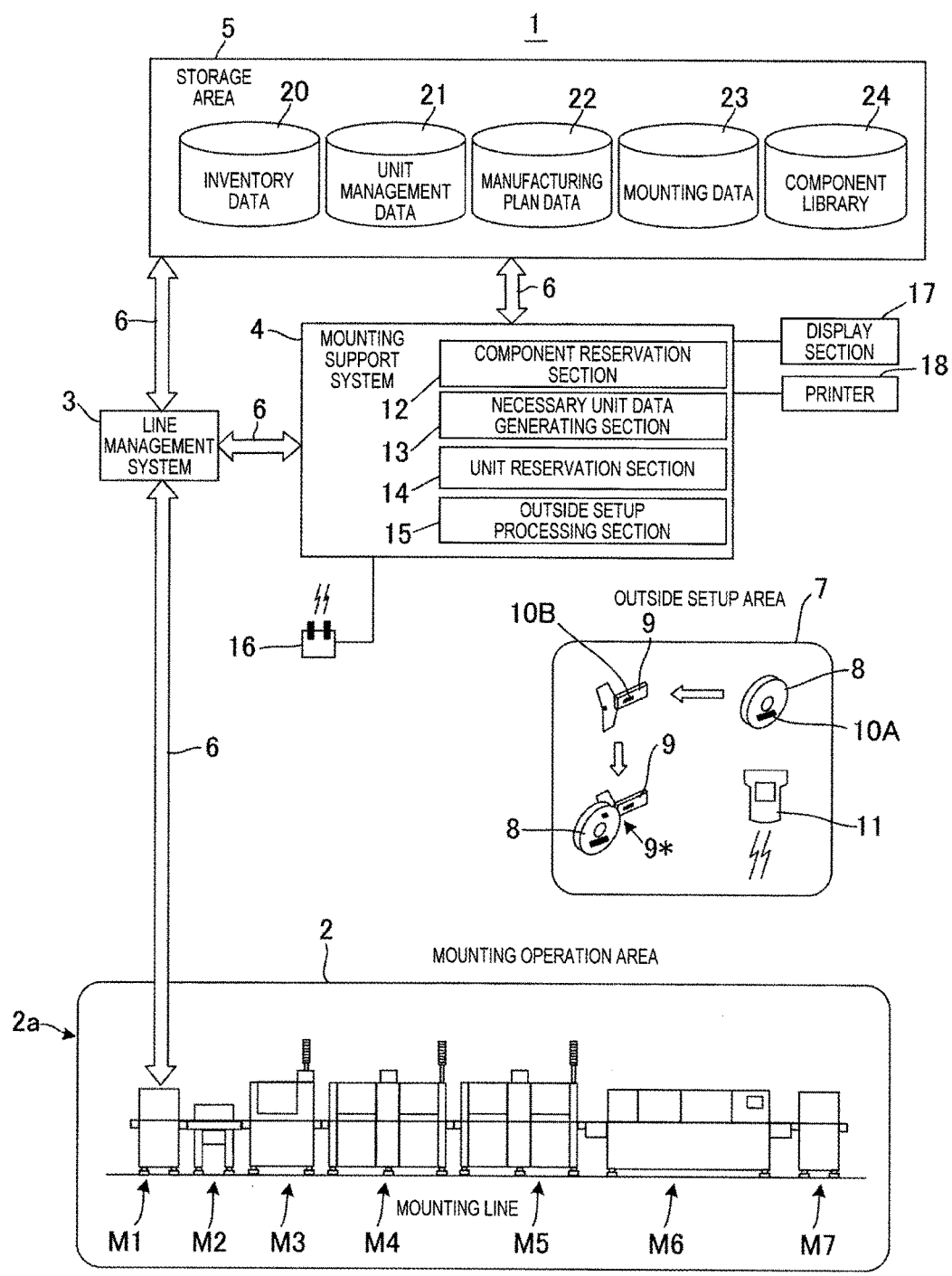

FIG. 2(a)

INVENTORY DATA REFERENCE PICTURE (UNIT)

| ID | TYPE | RESERVATION STATUS |
|---|---|---|
| 0001 | 110 | MANUFACTURING PLAN 01    MANUFACTURING PLAN 04 |
| 0002 | 110 | MANUFACTURING PLAN 01 |
| 0003 | 110 | MANUFACTURING PLAN 02 |
| 0004 | 115 | MANUFACTURING PLAN 01 |
| 0005 | 115 | MANUFACTURING PLAN 02 |
| 0006 | 115 | MANUFACTURING PLAN 03 |

FIG. 2(b)

INVENTORY DATA REFERENCE PICTURE (COMPONENT)

| ID | COMPONENT NAME | RESIDUAL NUMBER | LOCATION INFORMATION | RESERVATION STATUS |
|---|---|---|---|---|
| 0001 | A | 1400 | ***** | |
| 0002 | A | 2000 | ***** | |
| 0003 | A | 2000 | ***** | |
| 0004 | A | 3000 | ***** | |
| 0005 | B | 3000 | ***** | |
| 0006 | B | 1500 | ***** | |
| 0007 | B | 1500 | ***** | |
| 0008 | B | 1500 | ***** | |
| 0009 | C | 3000 | ***** | |
| 0010 | C | 2500 | ***** | |

FIG. 3(a)
UNIT MANAGEMENT DATA (USE LIMITS)

| NOZZLES / FEEDERS | | | |
|---|---|---|---|
| TYPE | NUMBER OF TIMES OF ABSORPTION | ABSORPTION ERROR RATE | MAXIMUM MAINTENANCE INTERVAL (DAYS/HOURS) |
| 110 | 1,000,000 | **% | 600H |
| 112 | 1,000,000 | **% | 600H |
| 113 | 1,000,000 | **% | 600H |
| 114 | 1,000,000 | **% | 600H |
| 115 | 500,000 | **% | 300H |
| 116 | 1,000,000 | **% | 800H |

FIG. 3(b)
UNIT MANAGEMENT DATA (USE HISTORIES)

| NOZZLES / FEEDERS | | | | | |
|---|---|---|---|---|---|
| TYPE | ID | Tag | CURRENT NUMBER OF TIMES OF ABSORPTION | ABSORPTION ERROR RATE | ELAPSED DAYS/HOURS FROM PRECEDING MAINTENANCE WORK |
| 110 | 0032 | | 496,184 | **% | 122H |
| 110 | 0033 | | 208,003 | **% | 121H |
| 110 | 0034 | | 668,398 | **% | 309H |
| 110 | 0035 | | 802,230 | **% | 401H |
| 110 | 0036 | | 25,786 | **% | 583H |
| 110 | 0037 | | 458,221 | **% | 617H |
| 112 | 0123 | | 802,020 | **% | 98H |
| 112 | 0127 | | 224,974 | **% | 104H |
| 112 | 0132 | | 13,539 | **% | 73H |

ELECTRONIC COMPONENT MOUNTING SYSTEM AND EQUIPMENT UNIT MANAGEMENT METHOD FOR ELECTRONIC COMPONENT MOUNTING SYSTEM

TECHNICAL FIELD

The present invention relates to an electronic component mounting system for mounting an electronic component on a board and an equipment unit management method for an electronic component mounting system for managing equipment units used in the electronic component mounting system.

BACKGROUND ART

An electronic component mounting system for manufacturing a mounted board by mounting an electronic component on a board include, in addition to a main body machine for mounting of an electronic component, equipment units which are used by being attached to the main body machine during a mounting operation. For example, to supply an electronic component held by a carrier tape, a tape feeder is used in combination with a tape reel on which the carrier tape is set being wound thereon. To pick up an electronic component supplied by the tape feeder, a nozzle is used which is attached to its mounting head and absorbs the electronic component.

Equipment units such as tape feeders and nozzles as mentioned above are used for a long time and hence it is not avoidable that they are deteriorated in function due to, for example, wear of their components that occurs during their use. The use of an equipment unit that has deteriorated in function in this manner is a factor in obstructing normal operation of the machine. For example, in the case of a tape feeder, the error of a component feed position would increase. In the case of a nozzle, an absorption failure that it cannot absorb an electronic component normally would occur frequently. Mounting machines in which the above problem is taken into consideration are known: these mounting machines have a function of counting and recording the number of times of operation of each such equipment unit that operates continuously and making a prescribed determination automatically by comparing an accumulated count with a preset limit number (refer to Patent Document 1, for example). In the related-art technique disclosed in Patent Document 1, the number of times of use of a supply means, that is, supply of a taping component by the supply means, is stored in a storage section of the supply means and a read-out accumulated count is compared with a preset limit number, whereby an end of life is predicted and a warning is issued that relates to timing of maintenance and inspection, for example.

RELATED ART DOCUMENTS

Patent Documents

Patent Document 1: JP-A-2000-208987

SUMMARY OF THE INVENTION

Problem to be Solved by the Invention

However, in the prior art technique disclosed in the above-mentioned Patent Document, the following problem arises when a mounting machine operates continuously to perform a component mounting operation. In the prior art technique, if the count reaches a prescribed limit number, a warning is issued even if the machine is actually in operation. And the machine is obliged to suspend its operation every time such a warning is issued. The supply means concerned needs to be replaced depending on its state. During replacement work, the mounting machine is suspended, which is a factor in lowering the operation rate. As such, the prior art technique has the problem that the operation rate lowers due to improper management of equipment units such as feeders for supplying components and nozzles, which is an obstruction to increase of productivity.

In view of the above, an object of the present invention is to provide an electronic component mounting system and an equipment unit management method for an electronic component mounting system which can prevent reduction of the machine operation rate and increase the productivity by properly managing equipment units to be used for component mounting operations.

Means for Solving the Problem

According to the present invention, there is provided an electronic component mounting system for manufacturing a mounted board by mounting an electronic component on a board, said electronic component mounting system including: an electronic component mounting line which performs a component mounting operation for mounting an electronic component; a manufacturing plan data storage section which stores, for each of a plurality of manufacturing lots of mounted boards serving as manufacturing subjects of the electronic component mounting line, manufacturing plan data that include at least a board type of each of the manufacturing lots, a manufacturing period of each of the manufacturing lots, and a number of boards to be manufactured of each of the manufacturing lots; a unit management data storage section which stores unit management data that include use permission information indicating a use permission status of an individual equipment unit to be used by being attached to the electronic component mounting line in the component mounting operation; an inventory data storage section which stores inventory data indicating a stock status of the equipment units; and unit reserving means for performing unit reservation processing including: performing new allocation processing of allocating an equipment unit necessary for manufacture of a new manufacturing lot to an equipment unit for a new manufacturing lot newly serving as the subject of manufacture of the electronic component mounting line; and registering an allocation result in the inventory data storage section, wherein the unit reserving means determines whether an equipment unit of an allocation subject in the new allocation processing can be allocated to an equipment unit for the new manufacturing lot by referring to use permission information of the equipment unit of the allocation subject, and if it is determined that the equipment unit of the allocation subject is usable, the unit reserving means performs the unit reservation processing.

According to the present invention, there is provided an equipment unit management method for an electronic component mounting system for managing an equipment unit to be used for an component mounting operation in an electronic component mounting system for manufacturing a mounted board by mounting an electronic component on a board, wherein the electronic component mounting system includes: an electronic component mounting line which performs a component mounting operation for mounting an electronic component; a manufacturing plan data storage section which stores, for each of a plurality of manufacturing lots of mounted boards serving as manufacturing subjects of the electronic component mounting line, manufacturing plan data that include at a least board type of each of the manufacturing lots, a manufacturing period of each of the manufacturing lots, and a number of boards to be manufactured of each of the manufacturing lots; a unit management data storage section which stores unit management data that include use permission information indicating a use permission status of an individual equipment unit to be used by being attached to the electronic component mounting line in the component mounting operation; and an inventory data storage section which stores inventory data indicating a stock status of the equipment units, wherein in unit reservation processing of performing unit reservation processing including: performing new allocation processing of allocating an equipment unit necessary for manufacture of a new manufacturing lot to an equipment unit for a new manufacturing lot newly serving as the subject of manufacture of the electronic component mounting line; and registering an allocation result in the inventory data storage section, whether an equipment unit of an allocation subject in the new allocation processing can be allocated to an equipment unit for the new manufacturing lot is determined by referring to use permission information of the equipment unit of the allocation subject, and if it is determined that the equipment unit of the allocation subject is usable, the unit reservation processing is performed.

Advantages of the Invention

According to the invention, unit management data including pieces of use permission information indicating use permission statuses of respective equipment units be used for component mounting operations are stored in advance. In unit reservation processing of performing new allocation processing and registering allocation results, whether it is possible allocate an equipment unit (allocation subject) to a new manufacturing lot is determined by referring to use permission information of the equipment unit concerned. If it is determined as being usable, unit reservation processing is performed on it. This makes it possible to prevent reduction of the machine operation rate and increase the productivity through proper management of equipment units to be used for component mounting operations.

BRIEF DESCRIPTION OF THE DRAWINGS

FIG. 1 illustrates the configuration of an electronic component mounting system according to an embodiment of the present invention.

FIGS. 2(a) and 2(b) show reference pictures of inventory data that are stored in a storage section of the electronic component mounting system according to the embodiment of the invention.

FIGS. 3(a) and 3(b) show reference pictures of unit management data that are stored in the storage section of the electronic component mounting system according to the embodiment of the invention.

MODE FOR CARRYING OUT THE INVENTION

Figure 4A:
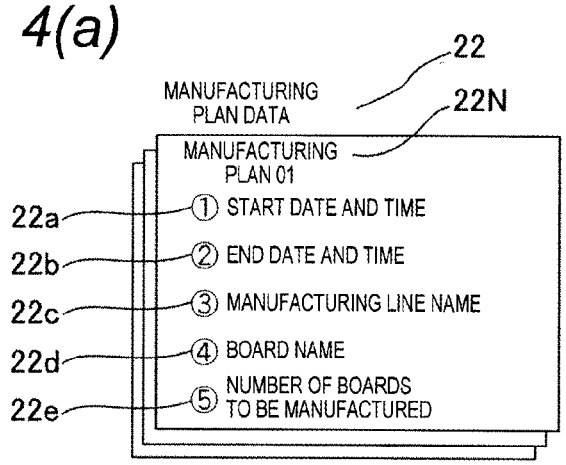
FIGS. 4(a)-4(c) illustrate structures of manufacturing plan data, mounting data, and a component library which are stored in the storage section of the electronic component mounting system according to the embodiment of the invention, respectively.

Next, an embodiment of the present invention will be described with reference to the drawings. First, the configuration of an electronic component mounting system 1 will be described with reference to FIG. 1. The electronic component mounting system 1 has a function of manufacturing mounted boards by mounting an electronic component on a board. An electronic component mounting line 2a which is a cascade connection of a board supply machine M1, a board transfer machine M2, a solder printing machine M3, a first electronic component mounting machine M4, a second electronic component mounting machine M5, a reflow machine M6, and a boards collection machine M7 is installed in a mounting operation area 2.

In a component mounting operation which is performed by the electronic component mounting line 2a, a board supplied from the board supply machine M1 carried in to the solder printing machine M3 via the board transfer machine M2. A solder printing operation of screen-printing solder for joining of an component on the board is performed in the solder printing machine M3. The screen-printed board is transferred sequentially to the first electronic component mounting machine M4 and the second electronic component mounting machine M5, where component mounting operations of mounting electronic components on the solder-printed board are performed. The board with components mounted thereon is carried in to the reflow machine M6, where it is heated according to a prescribed heating profile, whereby the solder for joining of components is melted and then solidified. As a result, the electronic components are soldered to the board and a mounted board in which the electronic components are mounted on the board is completed. Mounted boards are collected by the boards collection machine M7.

The electronic component mounting system 1 is equipped with a line management system 3, a mounting support system 4, and a storage section 5, which are connected to each other by a communication network 6 to enable exchange of data between them. The line management system 3 manages component mounting operations performed by the electronic component mounting line 2a which is installed in the mounting operation area 2. The mounting support system 4 performs, prior to a component mounting operation, mounting support operations of preparing electronic components and equipment units such as nozzles and parts feeders to be used for the component mounting operation. The storage section 5 is stored with data that are necessary for various kinds of processing of the line management system 3 and the mounting support system 4. In the following description, the electronic component, the parts feeder (tape feeder), and the equipment unit will be abbreviated as a "component," "feeder," and "unit," respectively.

The electronic component mounting system 1 is provided with an outside setup area 7, where prescribed setup work is performed for electronic components that are taken out of a component storage area (outside the areas of FIG. 1). Components to be mounted are supplied to the electronic component mounting line 2a after being subjected to outside setup work in the outside setup area 7. In this embodiment, a reel setup work of setting, prior to attachment to the machine, a reel 8 on a feeder (tape feeder) 9 having a function of feeding, pitch by pitch, a carrier tape wound on the reel 8 is outside setup work.

That is, feeder setup work of constructing a component supply unit 9* by setting a reel 8 that is taken out of the component storage area on a feeder 9 which is a unit is performed in the outside setup area 7. Component supply units 9* constructed by the feeder setup work are supplied to the first electronic component mounting machine M4 and the second electronic component mounting machine M5.

The mounting support system 4 is equipped with, as internal processing functions, a component reservation section 12, a necessary unit data generating section 13, a unit reservation section 14, and an outside setup processing section 15, as well as a display device 17 for displaying various pictures and a printer 18 for printing out various kinds of data. Therefore, results of data processing performed by the mounting support system 4 and various kinds of data stored in the storage section 5 can be output when necessary. The mounting support system 4 is also equipped with a receiving device 16 for receiving data that is input from a portable input terminal such as a bar code reader 11 which is manipulated in a supplementary area of the electronic component mounting system 1 such as the outside setup area 7 or the component storage area.

In feeder setup work which is performed in the outside setup area 7, bar code data that is written as component identification information on a bar code label 10A that is stuck to a reel 8 and bar code data that is written as unit identification information on a bar code label 10B that is stuck to a feeder 9 are read by a bar code reader 11. Reading results are sent by a wireless LAN function to the receiving device 16 which is provided in the mounting support system 4. As such, the bar code reader 11 and the receiving device 16 constitute an identification information reading section for reading component identification information for recognition and identification of an electronic component and unit identification information for recognition and identification of an equipment unit.

The storage section 5 is stored with inventory data 20, unit management data 21, manufacturing plan data 22, mounting data 2, and a component library 24. The structures of these data will be described below. The inventory data 20 are data that indicate stock statuses and allocation statuses in actual manufacturing plans of components and units to be used for component mounting operations of the electronic component mounting line 2a. In this embodiment, feeders 9 for supplying components to the electronic component mounting line 2a and nozzles for absorbing and holding components are units as example subjects of management. Naturally, a unit other than a nozzle or a feeder may be employed as a unit as a subject of management as long as it is used for component mounting operations in a replaceable manner.

Actual examples of the inventory data 20 will be described with reference to FIGS. 2(a) and 2(b). FIG. 2(a) shows an example that the inventory data 20 for units as mentioned above are displayed as a reference picture on the display screen 17a of the display device 17. This example is such that two kinds of data, that is, nozzles inventory data 20A in which nozzles are listed as units that are subjects of management and feeders inventory data 20B in which feeders are listed as units that are subjects of management, are displayed on the display screen 17a in a switchable manner. Cursors 17b and 17c for picture scrolling are set in the display screen 17a. The display range in the display screen 17a can be scrolled in the column direction and the row direction by manipulating the cursors 17b and 17c.

The nozzles inventory data 20A has a data structure that types 20b ("110," "115," . . . ) indicating such attributes as nozzle types and sizes and reservation statuses 20c are correlated with respective IDs 20a ("0001," "0002," . . . ) that are assigned for identification of the individual nozzles. In this example, each row corresponds to one individual nozzle. In each reservation status 20c box, the row direction (horizontal direction) corresponds to the time axis. In each reservation status 20c, manufacturing lots 22N (N=01, 02, . . . ) (see FIG. 4(a)) in which the nozzle concerned is planned to be used are displayed in time-series order in such a manner that their manufacturing periods are shown on the time axis.

For example, it is indicated that the nozzles whose IDs 20a are "0001," "0002," and "0004" are allocated (reserved) so as to be used for a component mounting operation of a manufacturing lot that is named a "manufacturing plan 01." Each manufacturing lot 22N in each reservation status 20c is displayed as a band whose start point and end point correspond to a start date and time 22a and an end date and time 22b of a manufacturing period in the manufacturing plan data 22 shown in FIG. 4(a). Likewise, the feeders inventory data 20B has a data structure that types 20b indicating such attributes as feeder types and reservation statuses 20c showing, in time-series order, manufacturing lots 22N in which respective feeders are planned to be used are correlated with respective IDs 20a that are assigned for identification of the individual feeders. That is, allocation results that are registered as the manufacturing plan data 22 in the storage section 5 include information relating to reserved manufacturing lots and manufacturing periods of the respective manufacturing lots.

FIG. 2(b) shows an example that component inventory data 20C for reels 8 which bear components are displayed on the display screen 17a of the display device 17. As in the above-described example, the display range in the display screen 17a can be scrolled in the column direction and the row direction by manipulating cursors 17b and 17c. The component inventory data 20C has a data structure that component names 20e ("A,", "B," . . . ), residual numbers 20f and pieces of location information 20g indicating the numbers of residual components that are set on reels 8 and locations of the reels 8, respectively, and pieces of reservation information 20h are correlated with respective IDs 20d ("0001," "0002," . . . ) that are assigned for identification of the individual reels 8.

In this example, each row corresponds to one individual reel 8. In each reservation information 20h box, the row direction (horizontal direction) corresponds to the time axis. In each piece of reservation information 20h, as in the example shown in FIG. 2(a), manufacturing lots 22N (see FIG. 4(a)) in which the component concerned is planned to be used are displayed in time-series order. A manufacturing lot 22N* shown in one piece of reservation information 20h indicates that a reel 8 whose ID 20d is "0008" and that corresponds to a component name B has been newly allocated by component reservation processing (see FIG. 6).

The unit management data 21 are data for individually managing the units to be used by being attached to the electronic component mounting line 2a in component mounting operations. In this embodiment, like the inventory data 20, the unit management data 21 have, as units that are example subjects of management, the feeders for supplying components and the nozzles for absorbing and holding components. As for the data contents, the inventory data 20 include use limit data that define use limits of the respective units, use history data indicating use histories of the respective units, and pieces of use permission information indicating use permission statuses of the respective units in the form of setting/non-setting of a tag. Each of the use limit data and the use history data include one or some of the numbers of times of absorption, absorption error rates, elapsed days or hours from preceding maintenance work.

An actual example of the unit management data 21 will be described with reference to FIGS. 3(a) and 3(b). FIG. 3(a) shows an example that use limit data that define use limits of the respective units of the use management data 21 for the units as mentioned above are displayed on the display screen 17a of the display device 17. This example is such that two kinds of data, that is, nozzle use limit data 21A for the nozzles (units) and feeder use limit data 21B for the feeders, are displayed on the display screen 17a in a switchable manner. As in the example shown in FIG. 2(a), the display range in the display screen 17a can be scrolled in the column direction and the row direction by manipulating cursors 17b and 17c.

The nozzle use limit data 21A has a data structure that the numbers of times of absorption, 21b, indicating upper limit numbers of times of use of the respective nozzles, absorption error rates 21c indicating upper limit frequencies of absorption errors that are allowable in a normal use state, and maximum maintenance intervals (days/hours) 21d indicating intervals in which maintenanceless use is allowed are correlated with respective types 21a ("110," "112," . . . ) indicating such attributes as nozzle types and sizes. In this example, each row corresponds to one nozzle type. Use limits are set in advance for the types 21a of all the types of nozzles that are expected to be used in the electronic component mounting system 1 and stored as part of the unit management data 21.

Likewise, the feeder use limit data 21B has a data structure that the numbers of times of absorption, 21b, indicating upper limit numbers of times of use of the respective nozzles, absorption error rates 21c indicating upper limit frequencies of absorption errors that are allowable in a normal use state, and maximum maintenance intervals (days/hours) 21d indicating intervals in which maintenanceless use is allowed are correlated with respective types 21a indicating such attributes as feeder types.

FIG. 3(b) shows an example that the use history data that define the use histories of the respective units of the use management data 21 for units as mentioned above are displayed on the display screen 17a of the display device 17. As in the above example, this example is such that two kinds of data, that is, nozzle use history data 21C for the nozzles (units) and feeder use history data 21D for the feeders, are displayed on the display screen 17a in a switchable manner.

The nozzle use history data 21C has a data structure that includes types 21f ("110," "112," . . . ) indicating such attributes as nozzle types and sizes, IDs 21g which are assigned for identification of the respective nozzles, tags 21h (pieces of use permission information) indicating use permission statuses of the respective nozzles in the form of setting/non-setting of a tag, current numbers of times of absorption, 21i, each of which indicates the number of times the corresponding nozzle has performed an actual absorbing operation in component mounting operations until the present time, absorption error rates 21j indicating frequencies of actual absorption errors that occurred in absorbing operations of the individual nozzles, and elapsed days/hours from preceding maintenance work, 21k. In this example, each row corresponds to one ID 21g. Such a use history is acquired for every nozzle used in the electronic component mounting system 1 and stored as a piece of unit management data 21.

In the unit management of the electronic component mounting system 1 according to the embodiment, if use history data of a unit acquired with actual component mounting operations has reached a use limit that is preset in the manufacturing plan data 22, the use permission information of this unit is set to "use prohibited." For example, in the nozzle use history data 21C shown in FIG. 3(b), the result value "617 H" of the elapsed days/hours from the preceding maintenance work, 21k, of the nozzle whose ID 21g is "0037" and type 21f is "110" exceeds the prescribed value "600 H" of the maximum maintenance interval (days/hours) 21d which is prescribed for this nozzle type "110" in the use limit data shown in FIG. 3(a). Therefore, the tag 21h (use permission information) of this nozzle is set to indicate "use prohibited." Likewise, if one of the number of times of absorption, the absorption error rate, the elapsed days/hours from the preceding maintenance work has reached the use limit that is prescribed in the nozzle use limit data 12A or the feeder use limit data 12B, the tag 21h (use permission information) is not set to indicate "use prohibited."

Likewise, the feeder use history data 21D has a data structure that includes types 21f indicating such attributes as nozzle types, IDs 21g which are assigned for identification of the respective feeders, tags 21h (pieces of use permission information) indicating use permission statuses of the respective feeders in the form of setting/non-setting of a tag, current numbers of times of absorption, 21i, each of which indicates the number of times the corresponding feeder has performed an actual absorbing operation in component mounting operations until the present time, absorption error rates 21j indicating frequencies of actual absorption errors that occurred in absorbing operations of the individual feeders, and elapsed days/hours from preceding maintenance work, 21k. Likewise, each row corresponds to one ID 21g. Such a use history is acquired for every feeder used in the electronic component mounting system 1 and stored as a piece of unit management data 21.

Figure 4B:
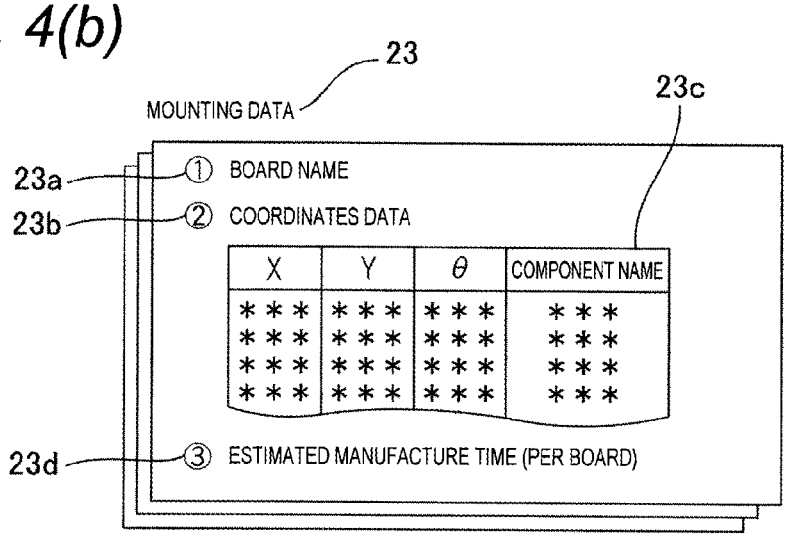
Figure 4C:
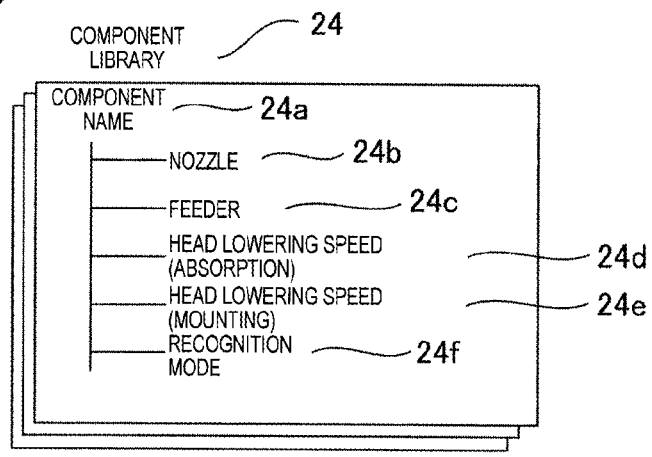

Next, the manufacturing plan data 22, the mounting data 23, and the component library 24 will be described with reference to FIGS. 4(a)-4(c). The manufacturing plan data 22 include at least a board type, a manufacturing period, the number of boards to be manufactured for each manufacturing lot of a mounted board to be manufactured by the electronic component mounting line 2a. Manufacturing plan data 22 of plural manufacturing lots are stored in the storage section 5. That is, as shown in FIG. 4(a), manufacturing plan data 22 prescribe the a start date and time 22a, an end date and time 22b, a manufacturing line name 22c, a board name 22d, and the number of boards to be manufactured, 22e, for each manufacturing lot 22N that is identified by a serial number, a symbol, or the like.

Each piece of the mounting data 23 is data that is directly used for execution of a component mounting operation and includes types, mounting positions, the numbers, etc. of components to be used in a component mounting operation. The mounting data 23 are stored in the storage section 5 for respective board types included in the manufacturing plan data 22. That is, as shown in FIG. 4(b), each piece of mounting data 23 has a structure that includes a board name 23a indicating a board type, coordinates data 23b which show sets of position coordinates in the X, Y, and θ directions for component names 23c of components to be mounted on the board, respectively, and an estimated manufacture time 23d. The estimated manufacture time 23d is an estimated (calculated) time to be required for a component mounting operation for manufacture of a single piece of the board.

The component library 24 is pieces of compatibility information each of which indicates compatibility between a component and a unit that is attached to the electronic component mounting machines in such a manner as to be combined with components. The data of the component library 24 are stored in the storage section 5 for respective components. That is, as shown in FIG. 4(c), each data of the component library 24 has a structure that a nozzle 24b and a feeder 24c that are compatible with a component, a head lowering speed (absorption) 24d and a head lowering speed (mounting) 24e which indicate proper operation speeds, and a recognition mode 24f are correlated with the component name 24a of the component.

In the above configuration, the storage section 5 serves as an inventory data storage section, a unit management data storage section, a manufacturing plan storage section, a mounting data storage section, and a component library storage section which are stored with the inventory data 20, the unit management data 21, the manufacturing plan data 22, the mounting data 2, and the component library 24, respectively.

Next, various mounting support processes which are executed by the mounting support system 4 when a component mounting operation is performed by the electronic component mounting system 1 will be described with reference to process flowcharts shown in FIGS. 5-9. First, a description will be made of a component reservation function of the component reservation section 12 which is used in a component management method for the electronic component mounting system 1. That is, the component reservation section 12 has a function of performing component reservation processing of performing new allocation processing of allocating new components that are necessary for manufacture of a new manufacturing lot (new subject of manufacture) of the electronic component mounting line 2a on the basis of necessary component data and registering allocation results in the storage section 5 as inventory data 20.

In this component reservation processing, necessary component data indicating types and numbers of components to be used in component mounting operations are calculated on a manufacturing lot by manufacturing lot basis on the basis of the manufacturing plan data 22 and the mounting data 23. As such, the component reservation section 12 functions as a necessary component data generating means for determining necessary component data on a manufacturing lot by manufacturing lot basis on the basis of the manufacturing plan data 22 and the mounting data 23.

Allocation results of the manufacturing plan data 22 registered in the storage section 5 include information relating to reserved manufacturing lots and their manufacturing periods (see FIGS. 2(a) and 2(b)). In the above-mentioned new allocation processing for a new manufacturing lot which is performed by the necessary unit data generating section 13, it is determined whether there exists another manufacturing lot that overlaps, in manufacturing period, with the new manufacturing lot and component reservation processing is performed only if no overlap is found. If it is found in the new allocation processing that the inventory data 20 indicate absence of components that can be allocated, the component reservation section 12 also performs processing of outputting a list of components that need to be replenished to complete manufacture of the new manufacturing lot.

Figure 5:
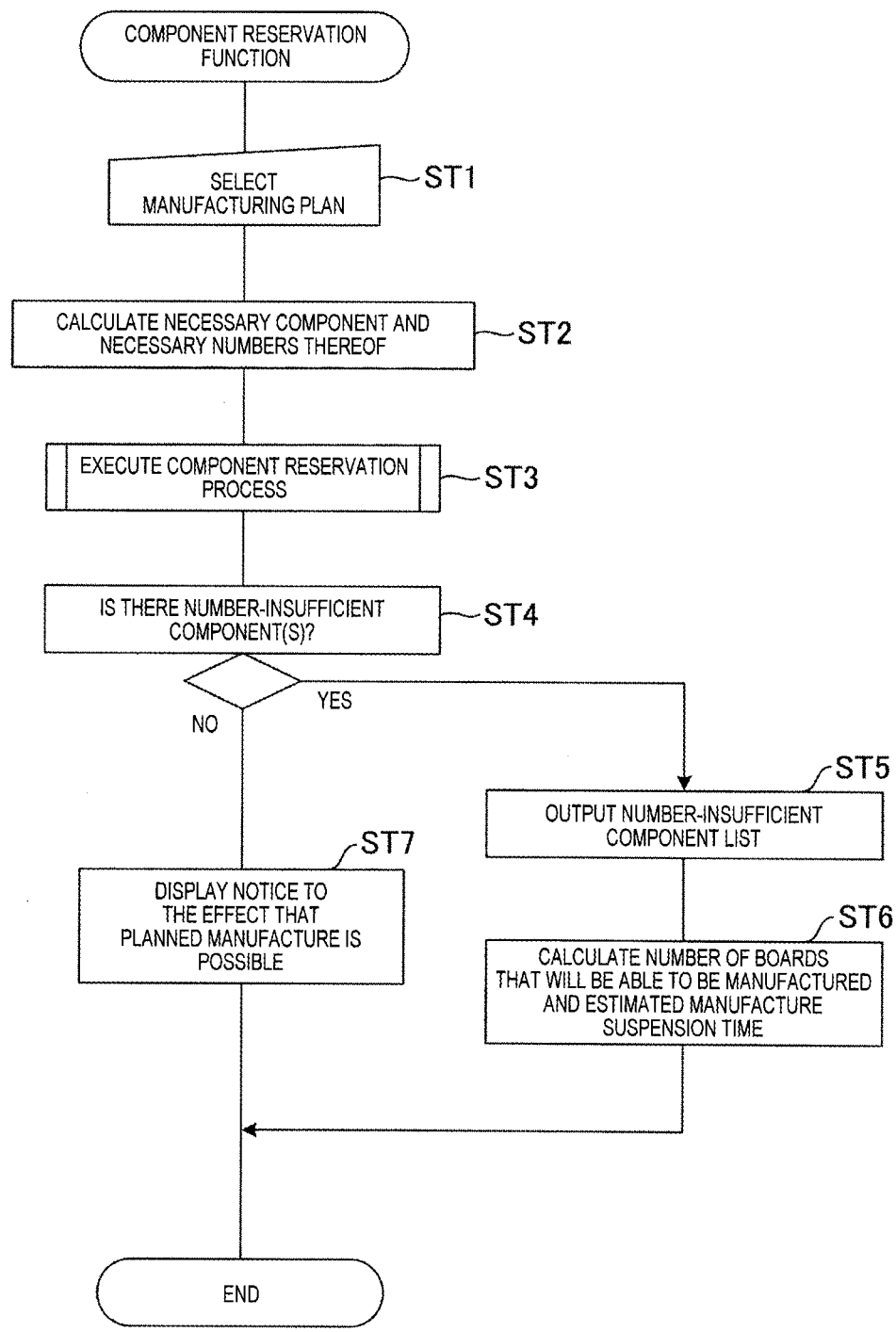
FIG. 5 is a flowchart showing a component reservation function of the electronic component mounting system according to the embodiment of the invention.

Now, the component reservation function which is performed by the component reservation section 12 will be described with reference to FIG. 5. First, the component reservation section 12 refers to the manufacturing plan data 22 stored in the storage section 5 and selects a manufacturing plan to be subjected to component reservation processing (ST1). As a result, a manufacturing lot 22N shown in FIG. 4(a) is selected and data items from a start date and time 22a to the number of boards to be manufactured, 22e, of a component mounting operation for this manufacturing lot are acquired.

Then the component reservation section 12 calculates necessary component data, that is, necessary components and necessary numbers of them, on the basis of the manufacturing plan data 22 and the mounting data 23 (ST2). This calculation processing is performed in such a manner as to form a necessary component list which shows, for respective component types, necessary numbers of components that are required by the manufacturing lot concerned. In this calculation processing, the mounting data 23 corresponding to the board name 22d that is given by the manufacturing plan data 22 is referred to, necessary numbers of respective component types per board are obtained from the list of component names 23c of components to be mounted on the board having the board name concerned, and the necessary numbers are multiplied by the number of boards to be manufactured, 22e, shown in the manufacturing plan data 22. As a result, necessary numbers of respective components required by the component mounting operation for the manufacturing lot concerned are determined as necessary component data. This calculation processing is performed by the component reservation section 12 which functions as the necessary component data generating means.

Then the component reservation section 12 executes a component reservation process (ST3). In the component reservation process, new allocation processing is performed to allocate components that are necessary for the manufacture of the new manufacturing lot (new subject of manufacture) to the new manufacturing lot on the basis of the necessary component data determined at step ST2 and allocation results are registered as inventory data 20 (see FIGS. 2(a) and 2(b)).

Figure 6:
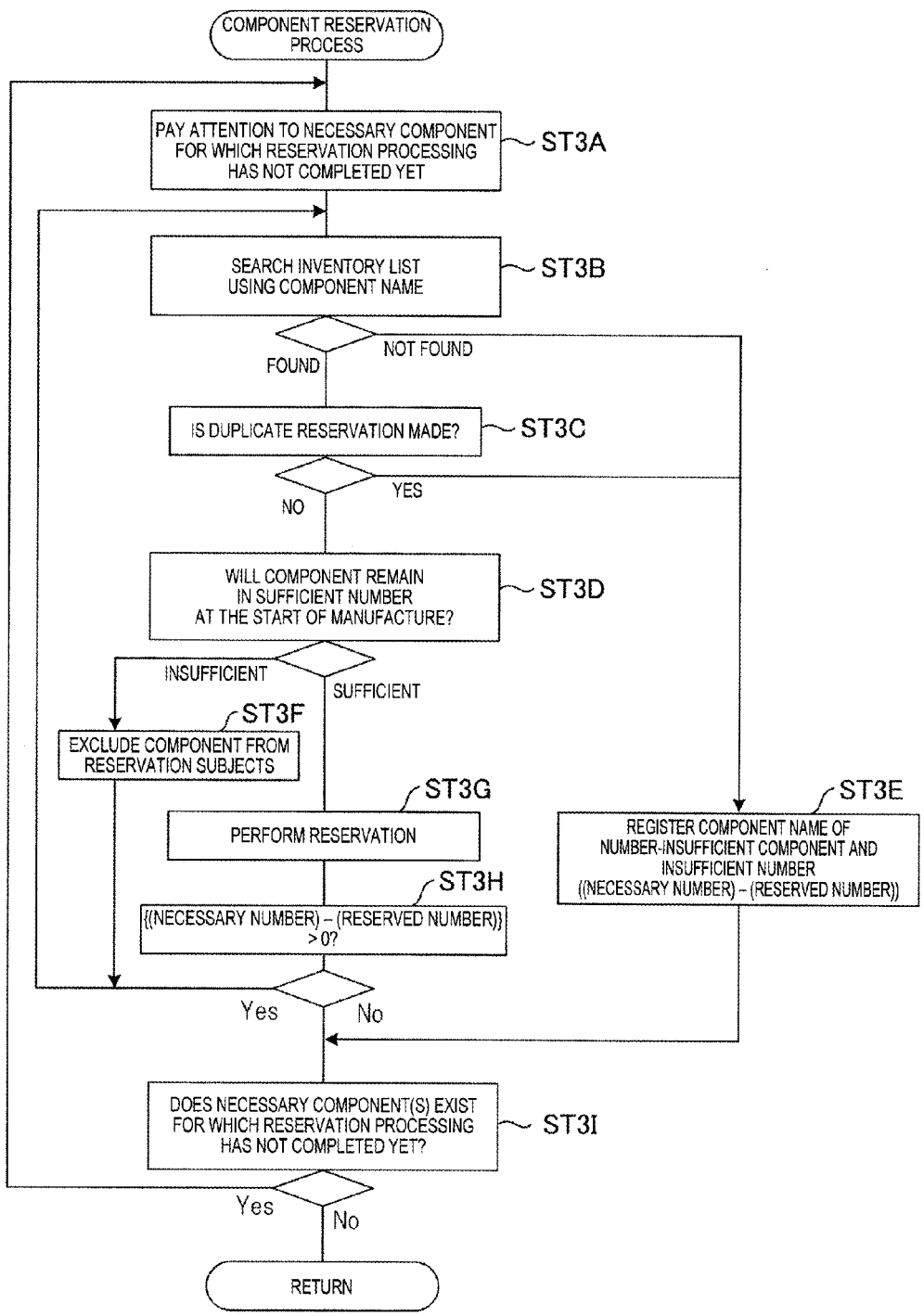
FIG. 6 is a flowchart of a component reservation process of the electronic component mounting system according to the embodiment of the invention.

Now, details of the component reservation process which is executed at step ST3 will be described with reference to a flowchart of FIG. 6. First, the component reservation section 12 refers to the above-mentioned necessary component list and determines a component to be subjected to the component reservation processing paying attention to a necessary component for which reservation has not completed yet (ST3A). Then the component reservation section 12 refers to the manufacturing plan data 22 and searches the inventory data 20C shown in FIG. 2(b) for the component to be subjected to the reservation processing using its component name (ST3B). This search is performed in such a manner that components having such IDs as to have already been reserved or be excluded from the subjects of reservation are excluded.

If a search result shows that the subject component exists in the component inventory data 20C, then the component reservation section 12 determines whether duplicate reservation is made or not (ST3C). That is, the component reservation section 12 checks whether or not the component is reserved for another manufacturing lot 22N whose manufacturing period (from the start date and time 22*a* to the end date and time 22*b*) overlaps with that of the manufacturing lot 22N for which the use of the subject component is reserved. If finding at step ST3B that the component concerned does not exist in the component inventory data 20C or determining at step ST3C that duplicate reservation is made, at step ST3E the component reservation section 12 determines that this reservation subject component may cause an insufficient number of components when a component mounting operation is performed according to the manufacturing plan and registers the component name and an insufficient number of components (i.e., (necessary number)−(reserved number)).

If the component concerned does not exist in the component inventory data 20C, the insufficient number itself is set equal to the necessary number because the reserved number is equal to 0. If it is determined at step ST3C that duplicate reservation is made, the insufficient number is set equal to the necessary number for the duplicate-reservation-found manufacturing lots 22N concerned minus a reserved number. The term "reserved number" means the number of components that are registered in the component inventory data 20C and hence are expected to be stocked. The thus-registered insufficient number is to be written in a number-insufficient component list (described later).

If determining at step ST3C that no duplicate reservation is made, then the component reservation section 12 determines whether or not the component concerned will remain in a sufficient number at the start of manufacture of the manufacturing lot 22N concerned by referring to the residual number 20*f* of the component inventory data 20C (ST3D). Whether the residual number is sufficient or not is determined by comparing it with a preset reference number which is usually set with some margin. However, the reference number may be set at 0 if it is desired to use the component concerned from the start of manufacture of the component mounting operation though the residual number is small.

If determining that the residual number is sufficient, the component reservation section 12 performs reservation processing of allocating the component concerned to the new manufacturing lot 22N* (ST3G). FIG. 2(*b*) shows an example that a reel 8 of a component name "B" whose ID 20*d* is "0008" in the component inventory data 20C is allocated to a new manufacturing lot 22N*. If determining that the residual number is insufficient, that is, smaller than the reference number, the component reservation section 12 excludes the component concerned from the reservation subjects (ST3F). After performing the reservation processing at step ST3G, the component reservation section 12 determines whether or not a relationship {(necessary number)−(reserved number)}>0 holds, that is, whether or not the necessary number is larger than the reserved number (ST3H).

If the determination result of this step is affirmative, that is, the necessary number is larger than the reserved number, or if the component concerned was excluded from the reservation subjects at step ST3F, the process returns to step ST3B to execute the above steps again for a reel 8 having the next ID. If the determination result of step ST3H is negative, that is, the necessary number is smaller than the reserved number, the process exits this closed loop, whereby the reservation process for the component having the component name concerned is completed.

Subsequently, the component reservation section 12 determines whether or not there exists a necessary component(s) for which the above reservation processing has not completed yet (ST3I). If the determination result of step ST3I is affirmative, that is, there exists a necessary component(s) that has not been subjected to the above reservation processing, the process returns to step ST3A to execute the ensuing steps again. If completion of the reservation process is recognized at step ST3I, the process returns to the main flow of FIG. 5.

At step ST4, the component reservation section 12 checks whether there exists a number-insufficient component(s) registered at step ST3E. If there exists a number-insufficient component(s), the component reservation section 12 outputs a list of number-insufficient components in the form of display by the display device 17 or printing by the printer 18 (ST5). Furthermore, if necessary, the component reservation section 12 calculates the number of boards that will be able to be manufactured in the event of a shortage of components and an estimated manufacture suspension time and outputs as appropriate (ST6). If determining at step ST4 that there is no number-insufficient component, the component reservation section 12 displays, on the display device 17, a notice to the effect that the planned manufacture is possible (ST7), whereupon the process executed by the component reservation function is finished.

Next, a unit reservation function of the necessary unit data generating section 13 and the unit reservation section 14 which are used in the component management method for the electronic component mounting system 1. That is, the necessary unit data generating section 13 performs processing of generating necessary unit data indicating types and the numbers of units to be used in a component mounting operation of each new manufacturing lot (new subject of manufacture) on the basis of the manufacturing plan data 22 and the mounting data 23. The unit reservation section 14 performs unit reservation processing of performing new allocation processing of allocating new units that are necessary for manufacture of a new manufacturing lot on the basis of the necessary unit data generated by the necessary unit data generating section 13 and registering allocation results in the storage section 5 which is the inventory data storage section.

As such, the necessary unit data generating section 13 and the unit reservation section 14 constitute a unit reserving means which performs unit allocation processing of performing new allocation processing of allocating new units that are necessary for manufacture of a new manufacturing lot (a new subject of manufacture of the electronic component mounting line 2*a*) to the new manufacturing lot and registering allocation results in the storage section 5 (inventory data storage section).

The unit reserving means determines whether or not an allocation subject unit of new allocation processing can be allocated to a new manufacturing lot by referring to the use permission information of the unit. If determining that it is usable, the unit reserving means performs unit allocation processing on it. Furthermore, the unit reserving means predicts use history data of a unit (a subject of unit reservation processing) after manufacture of the new manufacturing lot on the basis of the manufacturing plan data 22. If predicted use history data reaches use limit data, the unit reserving means does not perform unit reservation processing on the unit concerned.

Allocation results of the manufacturing plan data 22 registered in the storage section 5 include information relating to reserved manufacturing lots and their manufacturing periods (see FIGS. 2(a) and 2(b)). In new allocation processing, the unit reservation section 14 determines whether there exists another manufacturing lot that overlaps, in manufacturing period, with the new manufacturing lot and performs unit reservation processing is performed only if no overlap is found. If it is found in the new allocation processing that the inventory data 20 indicate absence of a unit(s) that can be allocated, the unit reservation section 14 performs processing of outputting a list of units that need to be replenished for manufacture of the new manufacturing lot.

Figure 7:
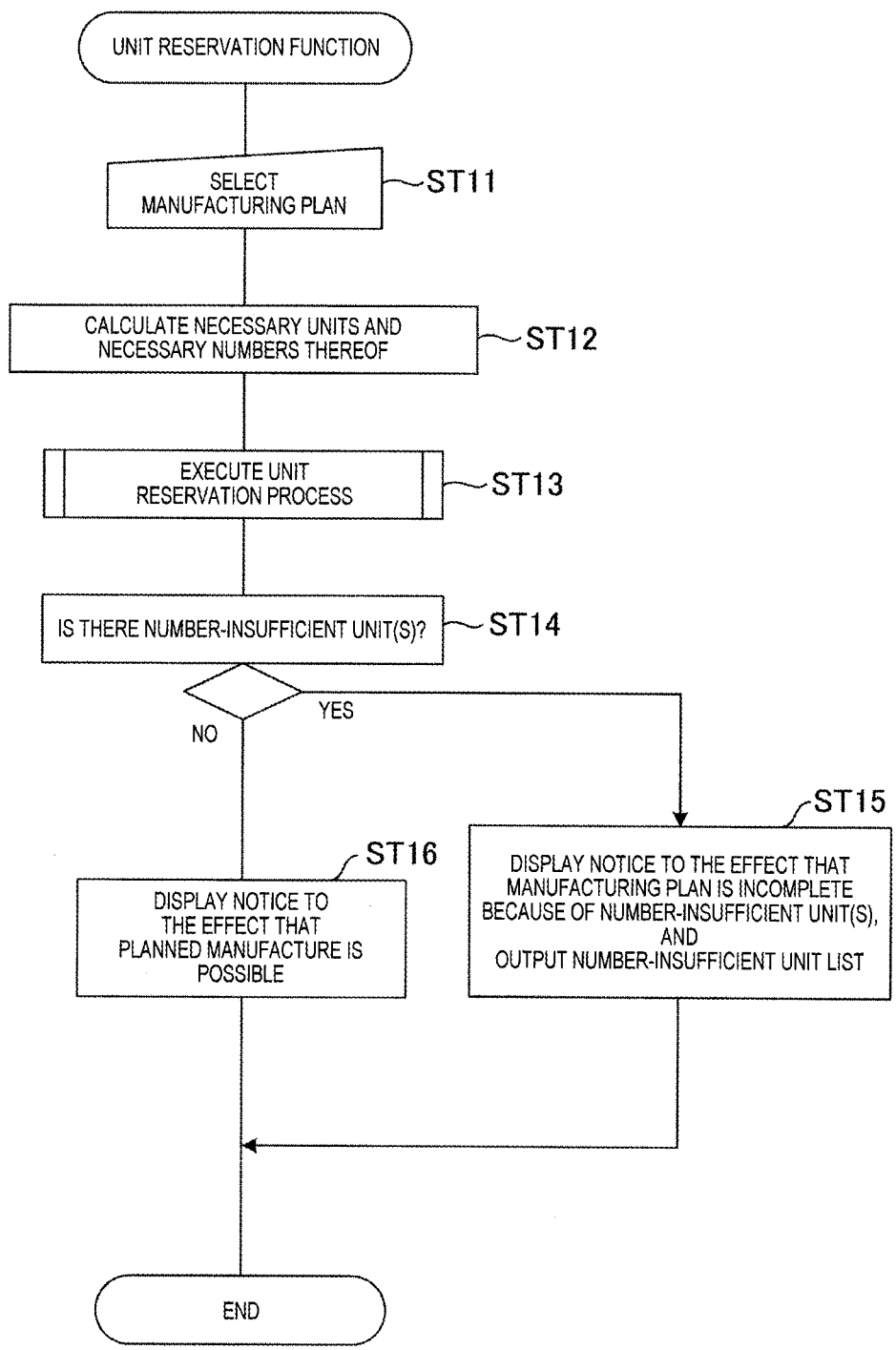
FIG. 7 is a flowchart showing a unit reservation function of the electronic component mounting system according to the embodiment of the invention.

Next, the unit reservation function which is performed by the unit reservation section 14 will be described with reference to FIG. 7. First, the unit reservation section 14 refers to the manufacturing plan data 22 stored in the storage section 5 and selects a manufacturing plan to be subjected to unit reservation processing (ST11). As a result, a manufacturing lot 22N shown in FIG. 4(a) is selected and data items from a start date and time 22a to the number of boards to be manufactured, 22e, of a component mounting operation for this manufacturing lot are acquired. Then the unit reservation section 14 calculates necessary unit data, that is, necessary units and necessary numbers of them, on the basis of the manufacturing plan data 22, the mounting data 23, and the component library 24 (ST12). This calculation processing is performed in such a manner as to form a necessary unit list which shows, for respective unit types, necessary numbers of units that are required by the manufacturing lot concerned. In this calculation processing, the mounting data 23 corresponding to the board name 22d that is given by the manufacturing plan data 22 is referred to, component names and their numbers are obtained from the list of component names 23c of components to be mounted on the board having the board name concerned, types of nozzles 24b and feeders 24c that are linked to the component names 24a in the component library 24 are determined, and necessary numbers of them are estimated for the respective units. This calculation processing is performed by the necessary unit data generating section 13.

Then the unit reservation section 14 executes a unit reservation process (ST13). In the unit reservation process, new allocation processing is performed to allocate units that are necessary for the manufacture of the new manufacturing lot to the new manufacturing lot (new subject of manufacture) on the basis of the necessary unit data determined at step ST12 and allocation results are registered as inventory data 20 (see FIGS. 2(a) and 2(b)).

Figure 8:
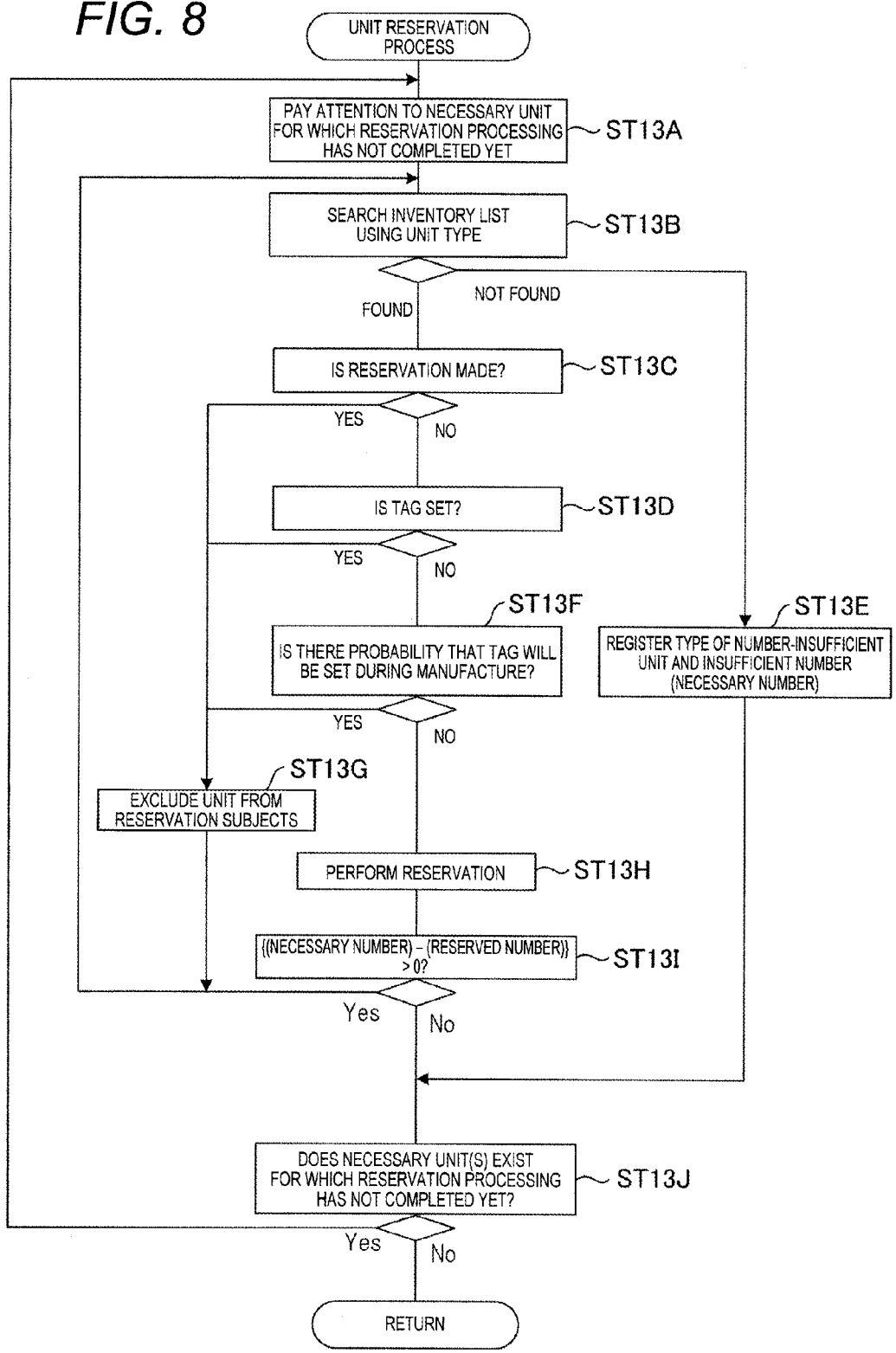
FIG. 8 is a flowchart of a unit reservation process of the electronic component mounting system according to the embodiment of the invention.

The unit reservation process which is executed at step ST13 shown in FIG. 7 will be described with reference to FIG. 8. First, the unit reservation section 14 refers to the above-mentioned necessary unit list and determines a unit to be subjected to the unit reservation processing paying attention to a necessary unit for which reservation has not completed yet (ST13A). Then the unit reservation section 14 refers to the manufacturing plan data 22 and searches the nozzles inventory data 20A and the feeders inventory data 20B of the units (nozzles and feeders) shown in FIG. 4(a) for the unit to be subjected to the reservation processing using its type (ST13B). This search is performed in such a manner that units that have already been reserved or be excluded from the subjects of reservation are excluded. If finding that the unit concerned does not exist in the nozzles inventory data 20A or the feeders inventory data 20B, at step ST13E the unit reservation section 14 determines that this reservation subject unit may cause an insufficient number of units when a component mounting operation is performed according to the manufacturing plan and registers the unit type and an insufficient number of units (necessary number).

If a search result shows that the subject unit exists in the nozzles inventory data 20A or the feeders inventory data 20B, then the unit reservation section 14 determines whether reservation is made or not (ST13C). That is, the unit reservation section 14 checks whether or not the use of the unit of the subject type is reserved for another manufacturing lot 22N whose manufacturing period (from the start date and time 22a to the end date and time 22b) overlaps with that of the manufacturing lot 22N for which the use of the unit of the subject type is reserved.

If determining at step ST13C that no reservation is made, then the unit reservation section 14 determines whether the tag 21h (see FIG. 3(b)) of the unit concerned is set or not (ST13D). If determining that the tag is not set, then the unit reservation section 14 determines whether or not it is probable that the tag 21h will be set during manufacture (ST13F). This determination is made by predicting a probability that any of the absorption error rate 21c and the number of times of absorption, 21j, and the elapsed days/hours from the preceding maintenance work, 21k, of the feeder use history data 21D, which indicate a use history of the unit concerned, will reach the use limit reference prescribed in the nozzle use limit data 21A or the feeder use limit data 21B. That is, the unit reservation section 14 estimates (calculates) the number of times of absorption, 21j, and elapsed days/hours from the preceding maintenance work, 21k, on the basis of the number of boards to be manufactured, 22e, of the manufacture plan data 22 and the estimated manufacture time 23d of the mounting data 23.

If determining at step ST13F that there is no probability that the tag will be set, the unit reservation section 14 performs reservation processing of allocating the unit of the subject type to the new manufacturing lot 22N* (ST13H). FIG. 2(a) shows an example that a nozzle of a type "115" whose ID 20a is "0004" in the nozzles inventory data 20A is allocated to a new manufacturing lot 22N*.

On the other hand, if determining at step ST13C that reservation is made, if determining at step ST13D that the tag is set, or if determining at step ST13F that it is probable that the tag will be set, the unit reservation section 14 excludes the unit of the type concerned from the reservation subjects (ST13G). That is, the unit reserving means predicts use history data of a unit (a subject of unit reservation processing) after manufacture of the new manufacturing lot on the basis of the manufacturing plan data. If predicted use history data reaches use limit data, the unit reserving means does not perform unit reservation processing on the unit concerned.

Then, after performing the reservation processing at step ST13H, the unit reservation section 14 determines whether or not a relationship {(necessary number)−(reserved number)}>0 holds, that is, whether or not the necessary number is larger than the reserved number (ST13I). If the determination result is affirmative (i.e., the necessary number is larger than the reserved number) or the unit concerned was excluded from the reservation subjects at step ST13G, the process returns to step ST13B to execute the above steps again for a unit having the next ID. If the determination result of step ST13I is negative, that is, the necessary number is smaller than the reserved number, the process exits this closed loop, whereby the reservation process for the unit of the type concerned is completed. Subsequently, the unit reservation section 14 determines whether or not there exists a necessary component(s) for which the above reservation processing has not completed yet (ST13J). If the determination result is affirmative, that is, there exists a necessary component(s) that has not been subjected to the above reservation processing, the process returns to step ST13A to execute the ensuing steps again. If completion of the reservation process is recognized at step ST13J, the process returns to the main flow of FIG. 7.

At step ST4, the unit reservation section 14 checks whether there exists a number-insufficient unit(s) registered at step ST13E. If there exists a number-insufficient unit(s), the unit reservation section 14 displays, on the display device 17, a notice to the effect that the manufacturing plan is incomplete because of an insufficient number of units and outputs a list of number-insufficient units in the form of display by the display device 17 or printing by the printer 18 (ST15). If determining at step ST14 that there is no number-insufficient unit, the unit reservation section 14 displays, on the display device 17, a notice to the effect that the planned manufacture is possible (ST16), whereupon the process executed by the unit reservation function is finished.

Figure 9:
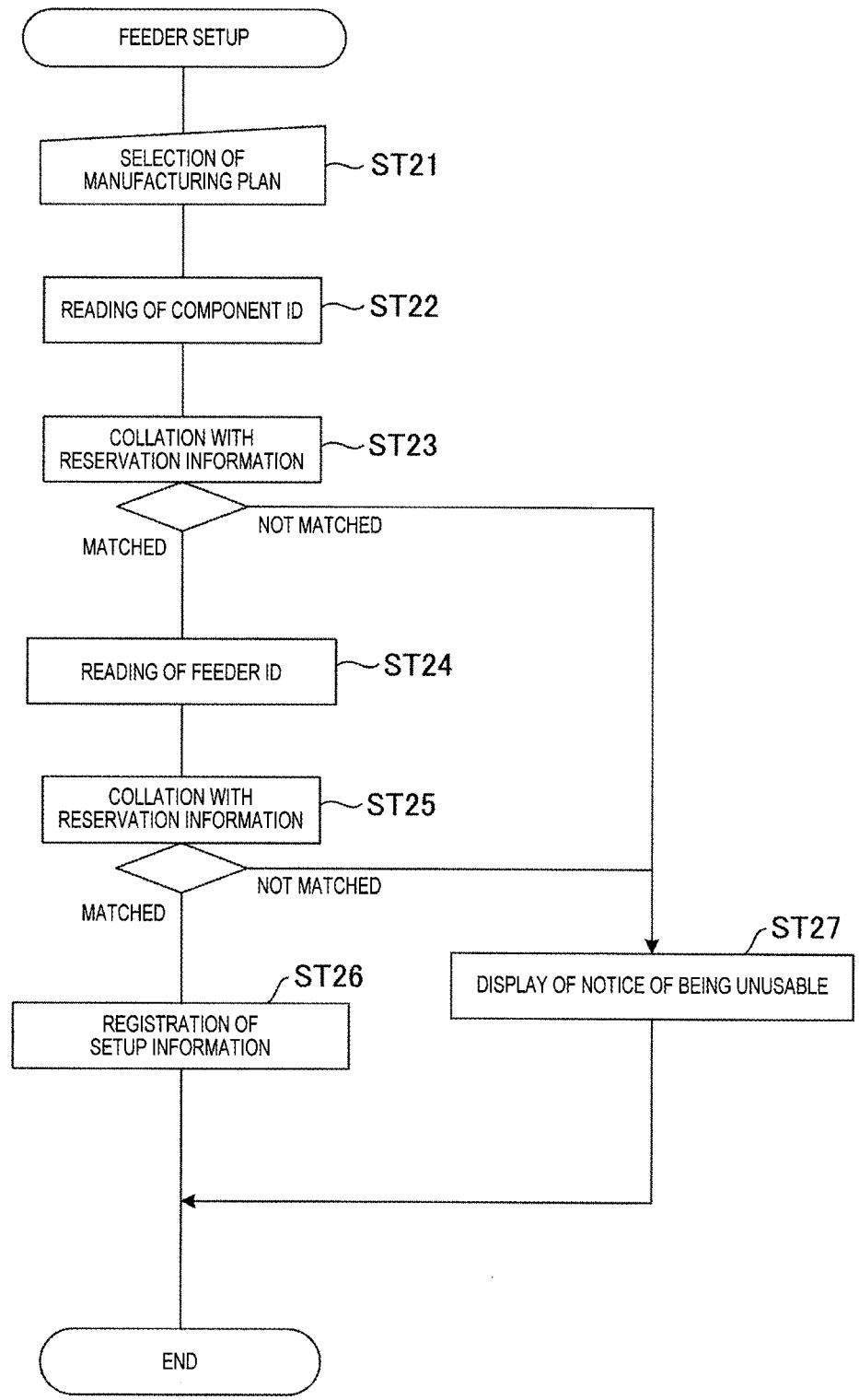
FIG. 9 is a flowchart of a feeder setup process of the electronic component mounting system according to the embodiment of the invention.

Next, a feeder setup function of the outside setup processing section 15 used in the equipment unit management method for the electronic component mounting system 1 will be described with reference to FIG. 9. In doing feeder setup work which is outside setup work of combining components with a unit in the outside setup area 7, that is, outside the electronic component mounting machines, the outside setup processing section 15 performs processing of reading, with the bar code reader 11 (identification information reading device), bar code data (component identification information) on a bar code label 10A that is stuck to a reel 8 (components) and bar code data (unit identification information) on a bar code label 10B that is stuck to a feeder 9 (unit) and registering those data as setup information as part of the inventory data 20 stored in the storage section 5.

First, the outside setup processing section 15 refers to the manufacturing plan data 22 stored in the storage section 5 and selects a manufacturing plan to be subjected to feeder setup processing (ST21). In subsequent outside setup processing for setting a reel 8 on a feeder 9 in the outside setup area 7, first a component ID is read (ST22). More specifically, bar code label 10A of a reel 8 to be subjected to setup is read by the bar code reader 11 and a reading result is transmitted to the outside setup processing section 15 of the mounting support system 4 via the receiving device 16. Then the outside setup processing section 15 performs collation with reservation information to check whether or not the reel 8 concerned corresponds to a correct component name that has been reserved being allocated to a selected manufacturing lot by referring to the component inventory data 20C of the inventory data 20 stored in the storage section 5 (ST23).

If the collation result is "OK" (i.e., the reel 8 coincides with a reserved one of the selected manufacturing lot) or the reel 8 is not found in the component inventory data 20C (i.e., it is not found in any manufacture plan), a feeder ID is read (ST24). More specifically, a bar code label 10B of a feeder 9 to be subjected to the setup is read by the bar code reader 11 and a reading result is transmitted to the outside setup processing section 15 of the mounting support system 4 via the receiving device 16. Then the outside setup processing section 15 performs collation with reservation information to check whether or not the feeder 9 concerned corresponds to a correct type that has been reserved being allocated to the selected manufacturing lot by referring to the feeders inventory data 20B of the inventory data 20 stored in the storage section 5 (ST25).

If the collation result is "OK" (i.e., the feeder 9 coincides with a reserved one of the selected manufacturing lot) or the feeder 9 is not found in the feeders inventory data 20B (i.e., it is not found in any manufacture plan), setup information that is a combination of the bar code data of the bar code labels 10A and 10B is registered in the inventory data 20 stored in the storage section 5 (ST26). If the collation result of step ST23 or ST 25 is "NG," that is, the component or unit is reserved for a manufacturing lot that is different from the selected one, the outside setup processing section 15 displays a notice to the effect that the component or unit is not usable (ST27).

As described above, if read-out component identification information indicates that the component has already been allocated to another manufacturing lot in the inventory data 20, the outside setup processing section 15 prohibits registration of setup information of the component. If read-out unit identification information indicates that the unit has already been allocated to another manufacturing lot in the inventory data 20 with an overlap in use period, the outside setup processing section 15 prohibits registration of setup information of the unit. These measures prevents an event that a use-planned unit is used for another manufacturing lot to cause an insufficient number of units and to thereby disable a component mounting operation according to a manufacturing plan.

As described above, in the electronic component mounting system 1 and the electronic component/equipment unit management method for the electronic component mounting system 1 according to the embodiment, necessary component data indicating types and numbers of electronic components to be used for component mounting operations and necessary unit data indicating types and numbers of equipment units to be used for the component mounting operations are determined in advance for respective manufacturing lots on the basis of manufacturing plan data, mounting data, and a component library. New allocation processing is performed which allocates, to a new manufacturing lot (new subject of manufacture) of the electronic component mounting line, electronic components and equipment units that are necessary for manufacture of the new manufacturing lot. Component/unit reservation processing is then performed which registers allocation results in the inventory data storage section.

Furthermore, in management of equipment units, unit management data including pieces of use permission information indicating use permission statuses of respective equipment units are stored in advance. In unit reservation processing of performing new allocation processing and registering allocation results, whether it is possible allocate an equipment unit (allocation subject) to a new manufacturing lot is determined by referring to use permission information of the equipment unit concerned. If it is determined as being usable, unit reservation processing is performed on it.

With the above measures, even in a case that a manufacturing plan is such that plural manufacturing lots exist for the same board type or a general-purpose component or a general-purpose equipment unit is used for plural board types, electronic components and equipment units can be allocated to each manufacturing lot correctly according to a manufacturing plan. Through proper management of electronic component and equipment units to be used for component mounting operations, whether each manufacturing plan can be performed can be determined correctly and reduction of the machine operation rate can be prevented to increase the productivity.

Furthermore, the storage section 5 of the electronic component mounting system 1 is stored with various data such as the inventory data 20, the unit management data 21, the manufacturing plan data 22, the mounting data 23, and the component library 23 which have the above-described structures. Therefore, improper use of an electronic component or an equipment unit in manufacture can be prevented by referring to the above data when necessary when the electronic component mounting line 2a starts to operate or is in operation. For example, improper use can be prevented by reading IDs of feeders and nozzles attached to the electronic component mounting machines and IDs of components that are set on the feeders immediately before manufacture is started after completion of a rearrangement operation that is associated with switching between board types and checking whether reading results coincide with reservation information and they are usable. Furthermore, proper use of electronic components and equipment units in manufacture can always be secured by reading those IDs and making checks as mentioned above in situations in which ID checks are possible such as at the time of component supply, feeder replacement, and nozzle replacement (during operation of the line).

Although the invention has been described in detail by referring to the particular embodiment, it is apparent to those skilled in the art that various changes and modifications are possible without departing from the spirit and scope of the invention.

The present application is based on Japanese Patent Application No. 2012-115305 filed on May 21, 2012, the disclosure of which is incorporated herein by reference.

INDUSTRIAL APPLICABILITY

Providing the advantage that reduction of the machine operation rate can be prevented and the productivity can be increased through proper management of equipment units to be used for component mounting operations, the electronic component mounting system and the equipment unit management method for an electronic component mounting system according to the invention are useful when applied to the field of electronic component mounting for manufacture of mounted boards by mounting of an electronic component on a board.

DESCRIPTION OF REFERENCE SIGNS

1: Electronic Component Mounting System
2a: Electronic Component Mounting Line
5: Storage Section
6: Communication Network
7: Outside Setup Area
8: Reel
9: Feeder
10A, 10B: Bar Code Label
11: Bar Code Reader
20A: Nozzles Inventory Data
20B: Feeders Inventory Data
20C: Component Inventory Data
21A: Nozzle Use Limit Data
21B: Feeder Use Limit Data
21C: Nozzle Use History Data
21D: Feeder Use History Data

The invention claimed is:

1. An electronic component mounting system for manufacturing a mounted board by mounting an electronic component on a board, said electronic component mounting system comprising:
an electronic component mounting line which performs a component mounting operation for mounting an electronic component;
a manufacturing plan data storage section which stores, for each of a plurality of manufacturing lots of mounted boards serving as manufacturing subjects of the electronic component mounting line, manufacturing plan data that comprise at least a board type of each of the manufacturing lots, a manufacturing period of each of the manufacturing lots, and a number of boards to be manufactured of each of the manufacturing lots;
a unit management data storage section which stores unit management data that comprise use permission information indicating a use permission status of an individual equipment unit to be used by being attached to the electronic component mounting line in the component mounting operation;
an inventory data storage section which stores inventory data indicating a stock status of the equipment units; and
a unit reserving section which performs unit reservation processing comprising: performing new allocation processing of allocating an equipment unit necessary for manufacture of a new manufacturing lot to an equipment unit for a new manufacturing lot newly serving as the subject of manufacture of the electronic component mounting line; and registering an allocation result in the inventory data storage section,
wherein the unit reserving section determines whether an equipment unit of an allocation subject in the new allocation processing can be allocated to an equipment unit for the new manufacturing lot by referring to use permission information of the equipment unit of the allocation subject, and if it is determined that the equipment unit of the allocation subject is usable, the unit reserving section performs the unit reservation processing,
wherein the unit management data comprise use history data indicating use history of the individual equipment unit and use limit data that define a use limit for each type of the equipment unit, and
wherein the unit reserving section predicts use history data, under a state after the manufacture of the new manufacturing lot, of an equipment unit of a subject of the unit reservation processing based on its manufacturing plan data, and does not perform the unit reservation processing on the equipment unit if the predicted use history data will reach the use limit data of the equipment unit of the subject of the unit reservation processing.

2. The electronic component mounting system according to claim 1,
wherein use permission information of an equipment unit having the use history data which has reached the use limit data thereof is set to be unusable.

3. The electronic component mounting system according to claim 1,
wherein the use history data and the use limit data comprise at least one of a number of times, an error rate, and elapsed days or hours from preceding maintenance work.

4. The electronic component mounting system according to claim 1,
wherein the equipment unit is a parts feeder for supplying an electronic component to the mounting line or a nozzle for absorbing and holding an electronic component.

5. An equipment unit management method for an electronic component mounting system for managing an equipment unit to be used for an component mounting operation in an electronic component mounting system for manufacturing a mounted board by mounting an electronic component on a board, wherein the electronic component mounting system comprises:
an electronic component mounting line which performs a component mounting operation for mounting an electronic component;
a manufacturing plan data storage section which stores, for each of a plurality of manufacturing lots of mounted boards serving as manufacturing subjects of the electronic component mounting line, manufacturing plan data that comprise at a least board type of each of the manufacturing lots, a manufacturing period of each of the manufacturing lots, and a number of boards to be manufactured of each of the manufacturing lots;
a unit management data storage section which stores unit management data that comprise use permission information indicating a use permission status of an individual equipment unit to be used by being attached to the electronic component mounting line in the component mounting operation;
an inventory data storage section which stores inventory data indicating a stock status of the equipment units; and
a unit reserving section which performs unit reservation processing comprising: performing new allocation processing of allocating an equipment unit necessary for manufacture of a new manufacturing lot to an equipment unit for a new manufacturing lot newly serving as the subject of manufacture of the electronic component mounting line; and registering an allocation result in the inventory data storage section,
said equipment unit management method comprising:
determining whether an equipment unit of an allocation subject in the new allocation processing can be allocated to an equipment unit for the new manufacturing lot by referring to use permission information of the equipment unit of the allocation subject; and
performing the unit reservation processing if it is determined that the equipment unit of the allocation subject is usable,
wherein the unit management data comprise use history data indicating use history of the individual equipment unit and use limit data that define a use limit for each type of the equipment unit; and
wherein in the unit reservation processing, use history data, under a state after the manufacture of the new manufacturing lot, of an equipment unit of a subject of the unit reservation processing is predicted based on its manufacturing plan data, and the unit reservation processing is not performed on the equipment unit if the predicted use history data will reach the use limit data of the equipment unit of the subject of the unit reservation processing.

6. The equipment unit management method for an electronic component mounting system according to claim 5,
wherein use permission information of an equipment unit having the use history data which has reached the use limit data is thereof is set to be unusable.

7. The equipment unit management method for an electronic component mounting system according to claim 5,
wherein the use history data and the use limit data comprise at least one of a number of times, an error rate, and elapsed days or hours from preceding maintenance work.

8. The equipment unit management method for an electronic component mounting system according to claim 5,
wherein the equipment unit is a parts feeder for supplying an electronic component to the mounting line or a nozzle for absorbing and holding an electronic component.

* * * * *